(12) United States Patent
Lee

(10) Patent No.: US 8,270,197 B2
(45) Date of Patent: Sep. 18, 2012

(54) METHOD OF OPERATING INFORMATION STORAGE DEVICE USING MAGNETIC DOMAIN WALL MOVEMENT

(75) Inventor: Sung-chul Lee, Osan-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 475 days.

(21) Appl. No.: 12/289,299

(22) Filed: Oct. 24, 2008

(65) Prior Publication Data

US 2009/0310241 A1 Dec. 17, 2009

(30) Foreign Application Priority Data

Jun. 16, 2008 (KR) .................. 10-2008-0056526

(51) Int. Cl.
*G11C 19/00* (2006.01)
(52) U.S. Cl. ............ 365/81; 365/148; 365/158; 365/80; 365/171; 365/173; 977/933
(58) Field of Classification Search .................. 365/48, 365/55, 62, 66, 74, 78, 80–93, 100, 130, 365/131, 148, 158, 171–173, 225.5, 243.5; 216/22; 257/421, E21.665; 438/3; 977/933–935
See application file for complete search history.

(56) References Cited

U.S. PATENT DOCUMENTS

| | | | |
|---|---|---|---|
| 6,834,005 B1 | 12/2004 | Parkin | |
| 6,955,926 B2 | 10/2005 | Chen et al. | |
| 7,242,604 B2 | 7/2007 | Klaeui et al. | |
| 7,626,844 B1 * | 12/2009 | Moriya et al. | ............... 365/80 |
| 7,667,994 B1 * | 2/2010 | Moriya et al. | ............... 365/81 |
| 2007/0262301 A1 | 11/2007 | Cowburn et al. | |
| 2008/0253161 A1 * | 10/2008 | Parkin et al. | ............... 365/80 |
| 2008/0278998 A1 * | 11/2008 | Cowburn et al. | ........... 365/171 |
| 2009/0103347 A1 * | 4/2009 | Parkin et al. | ............... 365/80 |

FOREIGN PATENT DOCUMENTS

| | | |
|---|---|---|
| KR | 10-2007-0030741 | 3/2007 |
| KR | 10-2007-0081387 | 8/2007 |
| KR | 10-2007-0087453 | 8/2007 |
| KR | 10-0785033 | 12/2007 |
| KR | 10-2008-0035216 | 4/2008 |

\* cited by examiner

*Primary Examiner* — Richard Elms
*Assistant Examiner* — Harry W Byrne
(74) *Attorney, Agent, or Firm* — Harness, Dickey & Pierce, PLC

(57) ABSTRACT

A method of operating an information storage device using a magnetic domain wall movement in a magnetic nanowire is provided. The magnetic nanowire includes a plurality of magnetic domains and pinning sites formed in regions between the magnetic domains. The method includes depinning the magnetic domain wall from a first pinning site by applying a first pulse current having a first pulse current density to the magnetic nanowire and moving the magnetic domain wall to a second pinning site by applying a second pulse current having a second pulse current density to the magnetic nanowire. The first pulse current density is greater than the second pulse current density.

7 Claims, 5 Drawing Sheets

METHOD OF OPERATING INFORMATION STORAGE DEVICE USING MAGNETIC DOMAIN WALL MOVEMENT

PRIORITY STATEMENT

This non-provisional patent application claims priority under 35 U.S.C. §119 to Korean Patent Application No. 10-2008-0056526, filed on Jun. 16, 2008, in the Korean Intellectual Property Office, the disclosure of which is incorporated herein in its entirety by reference.

BACKGROUND

DESCRIPTION OF THE RELATED ART

Examples of conventional non-volatile information storage devices, which retain recorded information even when power supply thereto is cut, include hard disk drives (HDDs) and nonvolatile random access memories (RAMs).

HDDs are information storage devices that have rotational parts, which tend to deteriorate. The deterioration results in a relatively high possibility of failure in operating HDDs, thereby reducing reliability.

Flash memory is an example of a non-volatile RAM. Flash memories do not include rotational parts, but relative to HDDs, flash memories have low read/write operating speeds, short lifespans, and small data storage capacities. Conventional flash memories also have relatively high manufacturing costs.

Another example of a conventional non-volatile information storage device is not that uses a principle of magnetic domain wall movement. In conventional magnetic information storage devices, a minute magnetic region in a ferromagnetic body is referred to as a magnetic domain, and a boundary region between magnetic domains that have different magnetization directions from each other is referred to as a magnetic domain wall. The magnetic domain wall has a given volume, and may be moved in the magnetic body by a current applied to the magnetic body.

An information storage device using magnetic domain wall movement may store a relatively large amount of information using a magnetic nanowire. However, in order to record and read information in the magnetic domain, the magnetic domain walls must be moved continuously, which consumes a relatively large amount of power and/or energy.

SUMMARY

Example embodiments relate to a method of reducing driving energy in operating information storage devices that use magnetic domain wall movement.

Example embodiments provide a method of operating information storage devices using magnetic domain wall movement that reduces required driving power and/or energy.

At least one example embodiment provides a method of operating an information storage device using a magnetic domain wall movement in a magnetic nanowire. The magnetic nanowire may include a plurality of magnetic domains and pinning sites formed in regions between the plurality of magnetic domains. According to at least one example embodiment, the magnetic domain wall may be depinned from a first pinning site by applying a first pulse current to the magnetic nanowire. The first pulse current may have a first pulse current density. The magnetic domain wall may be moved to a second pinning site by applying a second pulse current to the magnetic nanowire. The second pulse current may have a second pulse current density. The first pulse current density may be greater than the second pulse current density.

According to at least some example embodiments, the first pulse current density may be greater than a critical current density for moving the magnetic domain wall from the pinning site. The second pulse current density may have a duration longer than that of the first pulse current density. The first pulse current density may be a pulse current density associated with a minimum electrical energy used in the depinning operation and the second pulse current density may be a pulse current density associated with a minimum electrical energy in the moving operation, for example, in a state when the electrical energy used in the depinning operation is a minimum value. The first pulse current density and the second pulse current density may be pulse current densities for which a sum of electrical energies of the depinning and the moving operations is a minimum value.

BRIEF DESCRIPTION OF THE DRAWINGS

The present invention will become more apparent by describing in detail example embodiments thereof with reference to the attached drawings in which.

DETAILED DESCRIPTION OF EXAMPLE EMBODIMENTS

Figure 1:
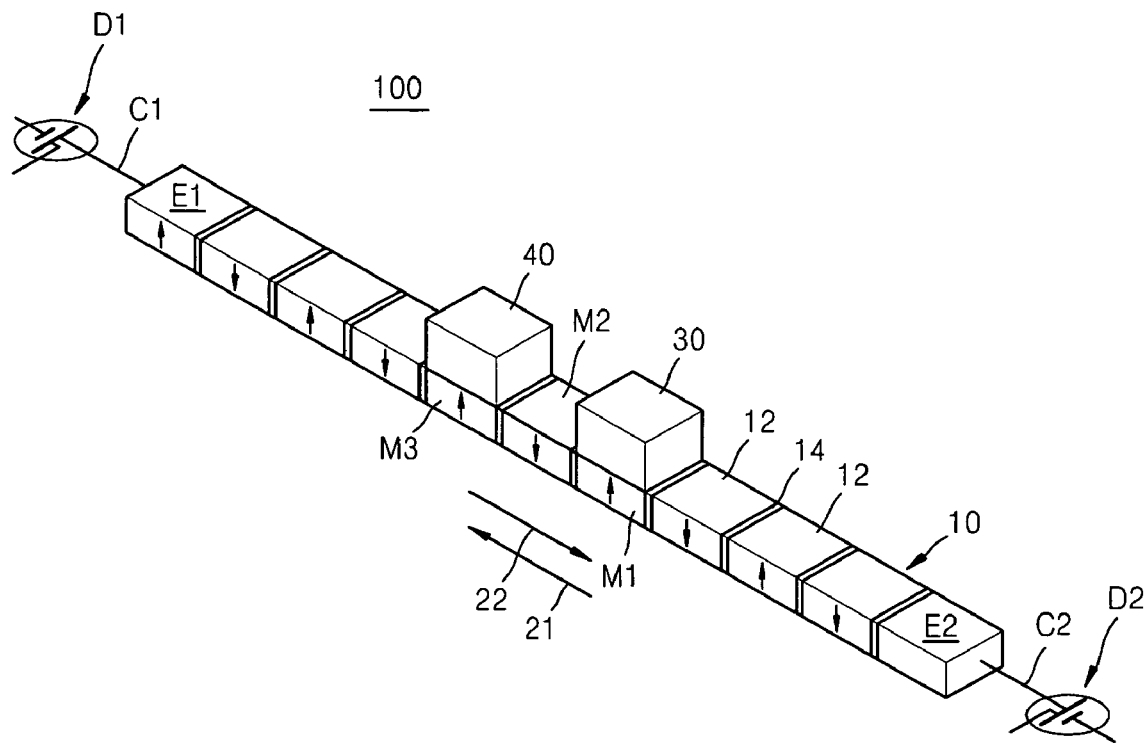
FIG. 1 is a perspective view of an example of an information storage device to which a method of operating an information storage device using magnetic domain wall movement according to an example embodiment may be applied.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a perspective view of an example magnetic information storage device 100 to which methods of operating information storage devices using magnetic domain wall movement according to example embodiments may be applied.

Referring to FIG. 1, the information storage device 100 may include a magnetic nanowire 10 that stores information (data). The magnetic nanowire 10 may include a plurality of magnetic domains 12. A magnetic domain wall 14 may be formed between each adjacent pair of magnetic domains 12. Each of the magnetic domains 12 is a unit region in which data may be stored.

In FIG. 1, a single magnetic nanowire 10 formed in a straight line is depicted. However, the magnetic nanowire 10 is a schematic drawing for explaining example embodiments, and thus, the magnetic nanowire 10 is not limited thereto. For example, a plurality of magnetic nanowires 10 may be formed in the information storage device 100 and the magnetic nanowire 10 may be formed in various shapes, for example, horizontally, vertically, curved, etc. Example embodiments may also be utilized/implemented in conjunction with these various types of magnetic domain information storage devices.

The magnetic nanowire 10 may include a pinning site (not shown) in a region where the magnetic domain wall 14 is formed so that the magnetic domain wall 14 may be pinned more readily. The pinning site may reduce a magnetic anisotropic potential of the corresponding magnetic domain wall 14. The pinning site may be formed by reducing an area of the magnetic domain wall 14 or may be formed of a material that reduces the magnetic anisotropic potential of the magnetic domain wall 14. The pinning site temporarily fixes the position of the magnetic domain wall 14, and when a given critical current is applied to the magnetic nanowire 10 the magnetic domain wall 14 is allowed to pass the pinning site.

In one example, a notch (not shown) may represent a pinning site. Alternatively, the pinning site may be formed by adding an additional material that is different from the magnetic nanowire 10 at a region of the magnetic nanowire 10. In this example, the magnetic domain wall 14 may be pinned by reducing the magnetic anisotropic potential of the region corresponding to the pinning site.

The magnetic nanowire 10 may include a first conductive wire C1 connected to a first end E1 of the magnetic nanowire 10, and a second conductive wire C2 connected to a second end E2 of the magnetic nanowire 10. The first conductive wire C1 may also be connected to the first driving device D1, and the second conductive wire C2 may also be connected to the second driving device D2. The first and second driving devices D1 and D2 may be transistors, diodes or the like. The first and second driving devices D1 and D2 and the first and second conductive wires C1 and C2 may constitute a current applying element that applies a current to the magnetic nanowire 10 for moving the magnetic domain wall.

When a current is applied via the first driving device D1, the magnetic domain wall 14 may move in a first direction (a direction indicated by an arrow 21 in FIG. 1). When a current is applied via the second driving device D2, the magnetic domain wall 14 may move in a second direction (a direction indicated by an arrow 22 in FIG. 1).

The current applying element shown in FIG. 1 is not limited thereto, but may be formed in various ways. For example, instead of the first and second conductive wires C1 and C2 being connected to the first and second driving devices D1 and D2, respectively; one of the first and second conductive wires C1 and C2 may be connected to each of the driving devices D1 or D2, or the second conductive wire C2 may be connected to the driving device D1 and the first conductive wire C1 may be connected to the driving device D2. In the structure of FIG. 1, a current for moving the magnetic domain wall is applied to the magnetic nanowire 10 via the first and/or second driving devices D1 and D2, and the moving direction of the magnetic domain wall 14 is determined according to the direction of the current to be applied to the magnetic nanowire 10. The magnetic domain wall 14 moves in the same direction as electrons, that is, in an opposite direction to the current direction.

The magnetic nanowire 10 may include a reading element 30 for reproducing data and a writing element 40 for writing data. Each of the reading element 30 and the writing element 40 may be positioned on the magnetic nanowire 10 to correspond to respective ones of the magnetic domains 12. The reading element 30 and the writing element 40 may be devices that use, for example, a tunnel magneto resistance (TMR) effect or a giant magneto resistance (GMR) effect. Devices that use the TMR effect and the GMR effect are well known in the art, and thus, a detailed description thereof will be omitted.

Example embodiments are not limited to the principles and structures of the reading element 30 and the writing element 40 shown in FIG. 1, but may be implemented/utilized in connection with various magnetic domain information storage devices. For example, the writing element 40 may write data using an external magnetic field. In another example, the writing element 40 may use a spin torque phenomenon of electrons to write data.

The electron spin of the magnetic domains 12 may be a vertical magnetic spin or a horizontal magnetic spin. The electron spin of the magnetic domains 12 may be determined according to the material of the magnetic nanowire 10.

Instead of the reading element 30 and the writing element 40 in the magnetic nanowire 10 being separate, a reading/writing element that performs both writing and reading functions may be included.

While the magnetic domain wall 14 is moved in a bit unit by applying a given, desired or predetermined pulse current to the magnetic nanowire 10 via the first and/or second driving devices D1 and/or D2, data recorded in the magnetic nanowire 10 may be reproduced by applying a reading current to the reading element 30 or data may be recorded in the magnetic nanowire 10 by applying a writing current to the writing element 40.

A method of driving the information storage device 100 that uses magnetic domain wall movement according to an example embodiment will now be described with reference to FIG. 1.

Referring to FIG. 1, information may be recorded in a first magnetic domain M1 using the writing element 40. Information may be recorded by applying a writing current through the writing element 40 to set a magnetic anisotropic direction in the first magnetic domain M1. A moving pulse current may then be applied by, for example, the second driving device D2 to move the magnetic domains 12 to a neighbor magnetic domain region in the second direction 22. The magnetic domains 12 may stop in the neighbor magnetic domain region. The magnetic anisotropic direction of a second magnetic domain M2 may then be set using the writing element 40. The magnetic anisotropic direction of the second magnetic domain M2 may be set in the same manner as the first magnetic domain M1 as discussed above. The magnetic anisotropic direction of the second magnetic domain M2 may be determined according to the direction of the writing current.

A method of reading information will now be described. Still referring to FIG. 1, according to at least one example embodiment, a reading current may be applied to the first magnetic domain M3 using the reading element 30. A current passing through the magnetic domain M3 may be measured to read information recorded in the magnetic domain M3. The magnetic domain M3 may then move in response to a moving pulse applied via the first or second driving devices D1 or D2 to read information in other magnetic domain continuously or substantially continuously.

As seen in methods of reading and writing information according to example embodiments described above, in the information storage device 100 that uses magnetic domain wall movement, the magnetic domain walls are moved to read and write information in the magnetic domains 12.

Figure 2:
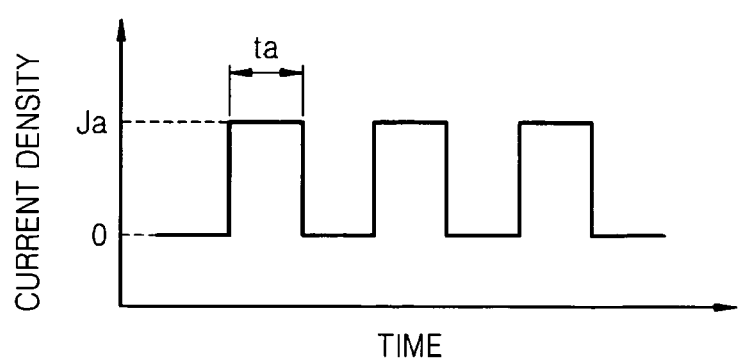
FIG. 2 is a timing diagram showing a conventional method of operating an information storage device.

FIG. 2 is a timing diagram showing a conventional method of driving an information storage device.

Referring to FIG. 2, a pulse current Ja is applied to a driving device (e.g., D1 or D2) for moving a magnetic domain wall so that the magnetic domain wall 14 may move out from a pinning site. For this purpose, the pulse current Ja may have a pulse current density greater than a critical current density for depinning the magnetic domain 14 (moving the magnetic domain 14 out from the pinning site). The pulse current Ja may have a given, desired or predetermined duration ta sufficient to move only one magnetic domain wall 14.

Figure 3:
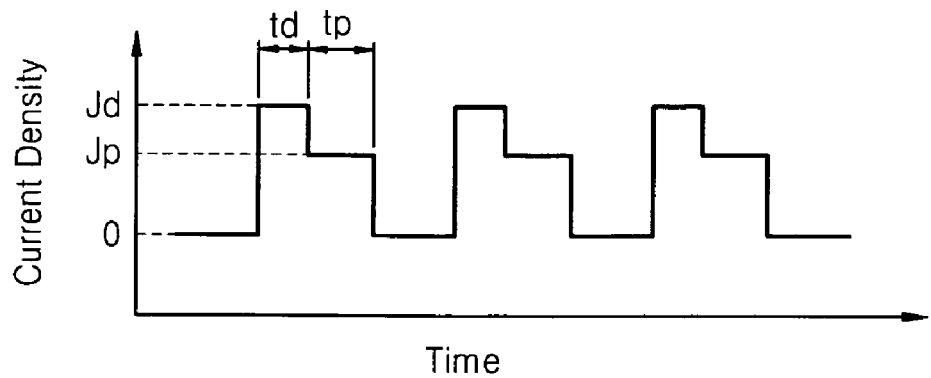
FIG. 3 is a timing diagram for illustrating a method of operating an information storage device according to an example embodiment.

FIG. 3 is a timing diagram showing an example embodiment of a method of driving the information storage device 100.

Referring to FIGS. 1 and 3, a moving current applied to the driving device for moving the magnetic domain wall 14 may include a first pulse current Jd for moving a magnetic domain wall 14 out from a pinning site (depinning) and a second pulse current Jp for moving the magnetic domain wall 14 after the magnetic domain wall has been depinned. The first pulse current Jd may have a first pulse current density, which is greater than a critical current density. The second pulse current Jp may have a second pulse current density.

The second pulse current density of the second pulse current Jp may be lower than the first pulse current density of the first pulse current Jd. The first pulse current Jd and the second pulse current Jp may vary according to the material and/or thickness of the magnetic nanowire 10. A second duration tp of the second pulse current Jp may be longer than a first duration td of the first pulse current Jd. This may reduce the sum of the energy associated with the first pulse current Jd and the second pulse current Jp because the energy associated with the second pulse current Jp is lower than the energy associated with the first pulse current Jd. Example embodiments may reduce the power and/or energy required for operating the information storage device 100. The first pulse current Jd and the second pulse current Jp may be determined using a reduced (e.g., minimum) energy in a depinning operation and a propagation operation, respectively.

An energy simulation result of moving current of a magnetic domain wall according to an example embodiment will now be described.

A magnetic nanowire used in the simulation was a Co/Pt layer having a vertical magnetic directionality, a width of 60 nm, a height of 5 nm, and a magnetic domain length of 160 nm. Also, the magnetic nanowire had a damping constant of 0.1, spin polarization of 0.7, magnetic anisotropic energy Ku of $10^6$ erg/cc, saturation magnetization Ms of 200 emu/cc, exchange constant A* of $1\times10^{-6}$ erg/cc, and non-adiabaticity beta of 0.01. The pinning site was a notch.

Figure 4:
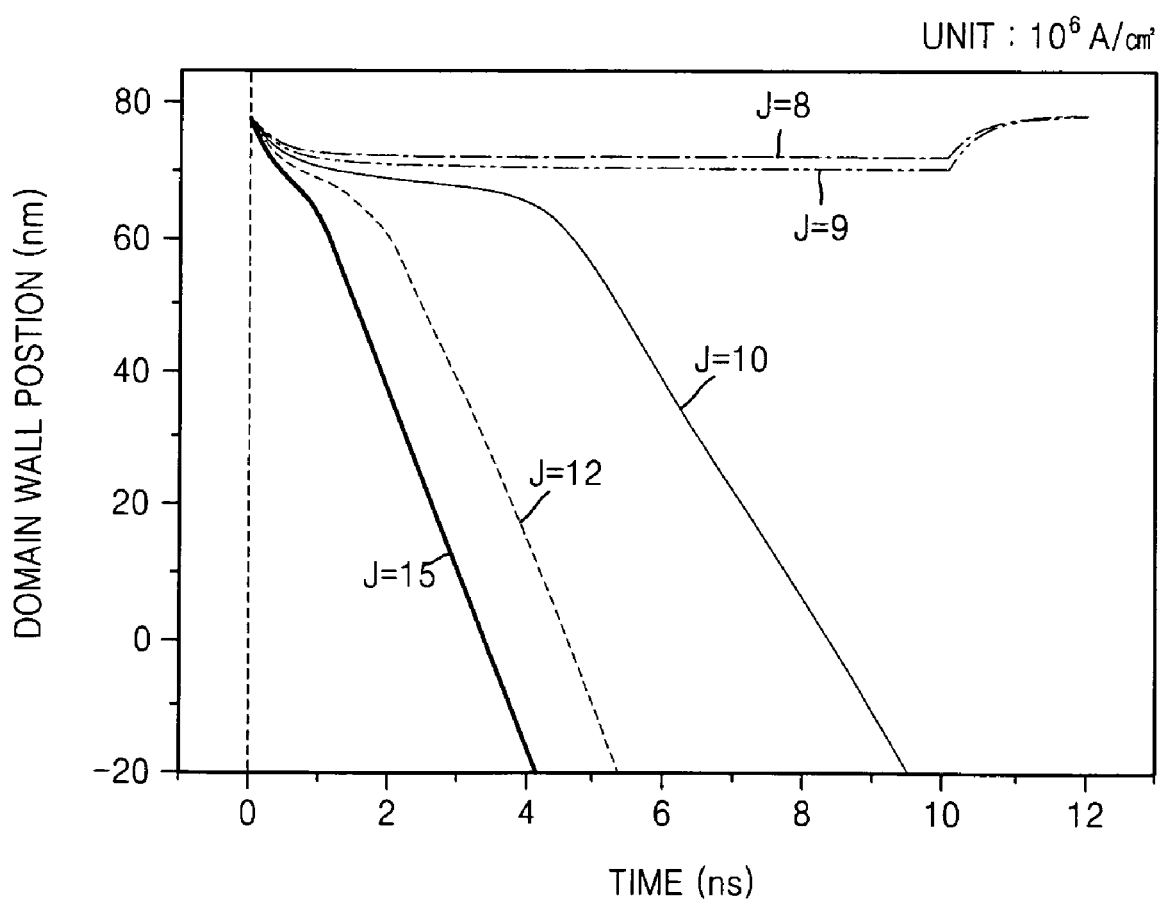
FIG. 4 is a graph showing a depinning phenomenon of an information storage device according to the current densities.
Figure 5:
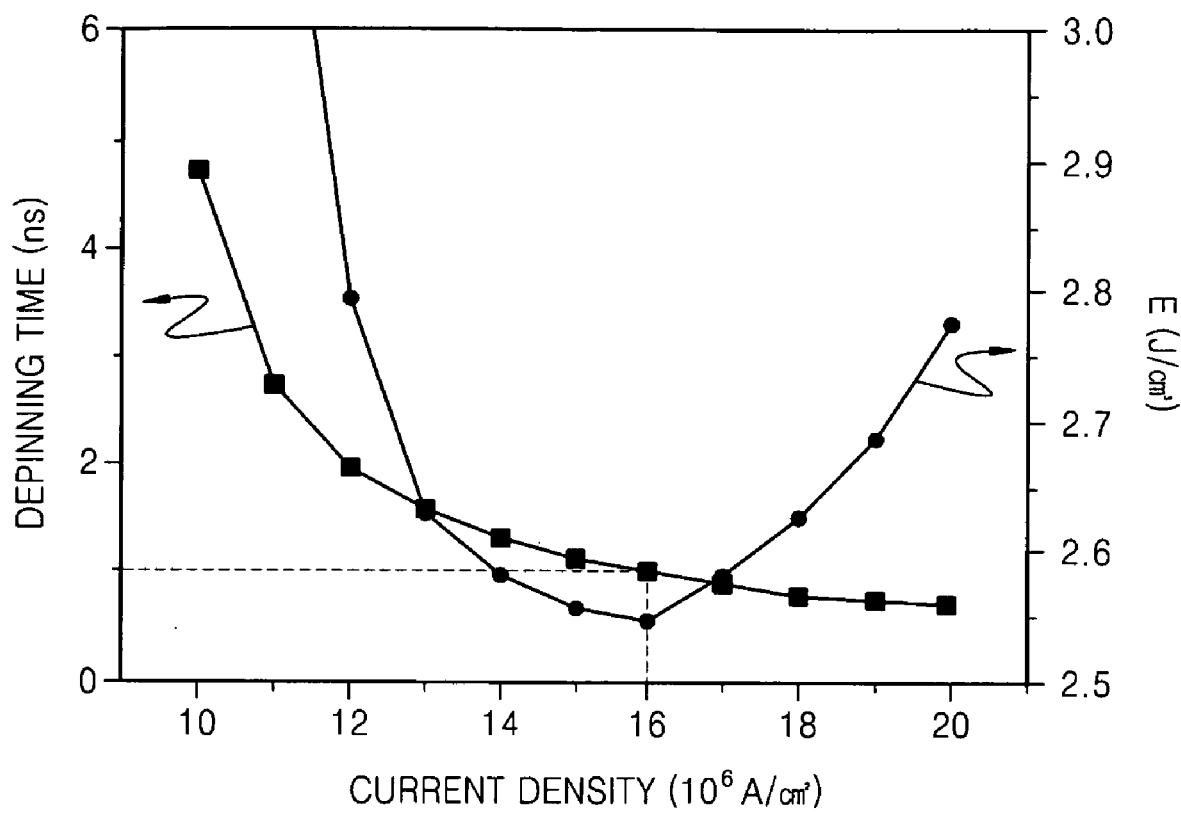
FIG. 5 is a graph showing the variations of depinning time and electrical energy of an information storage device according to the current densities.

FIGS. 4 and 5 are graphs showing data yielded in a simulation of a depinning process in which the magnetic domain wall is initially moved from a pinning site.

FIG. 4 is a graph showing a depinning phenomenon of an information storage device according to current densities.

Referring to FIG. 4, with a current density of about $9\times10^6$ A/cm$^2$, the depinning does not occur whereas, with a current density of about $10\times10^6$ A/cm$^2$ or greater, the magnetic domain wall is depinned. Thus, in this example, the critical current density for depinning the magnetic domain wall is about $10\times10^6$ A/cm$^2$. As shown, as the current density increases, the depinning time and the propagation time are reduced.

FIG. 5 is a graph showing the variations of depinning time and electrical energy of the information storage device 100 according to current densities.

Referring to FIG. 5, when the current density of a first pulse for depinning is increased, the depinning time is reduced. However, the reduction ratio of depinning time is gradually reduced by increasing the current density. Also shown in FIG. 5, a minimum point of depinning energy occurs at a current density of about $16\times10^6$ A/cm$^2$. At a current density of about $16\times10^6$ A/cm$^2$, the depinning time is about 1 nanoseconds (nsec).

Figure 6:
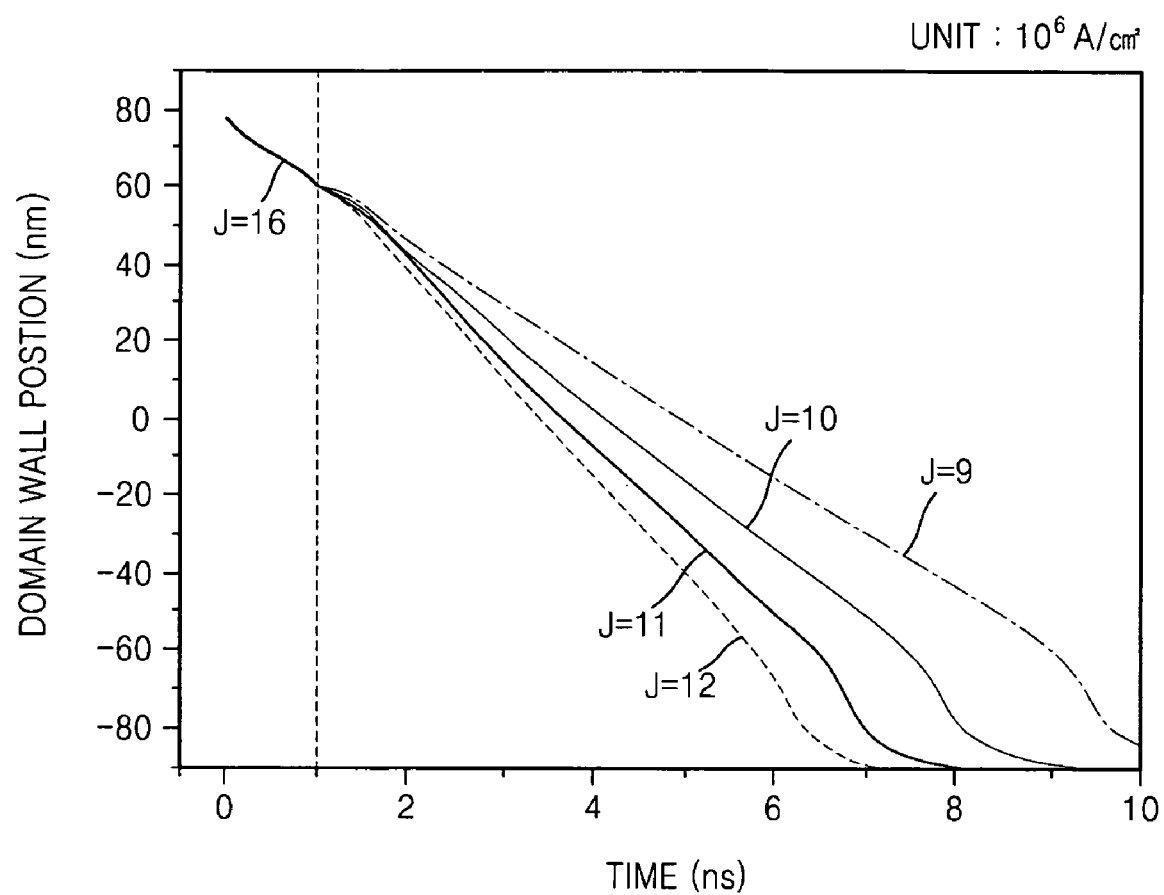
FIG. 6 is a graph showing propagation time of an information storage device according to the current density of a second pulse current.
Figure 7:
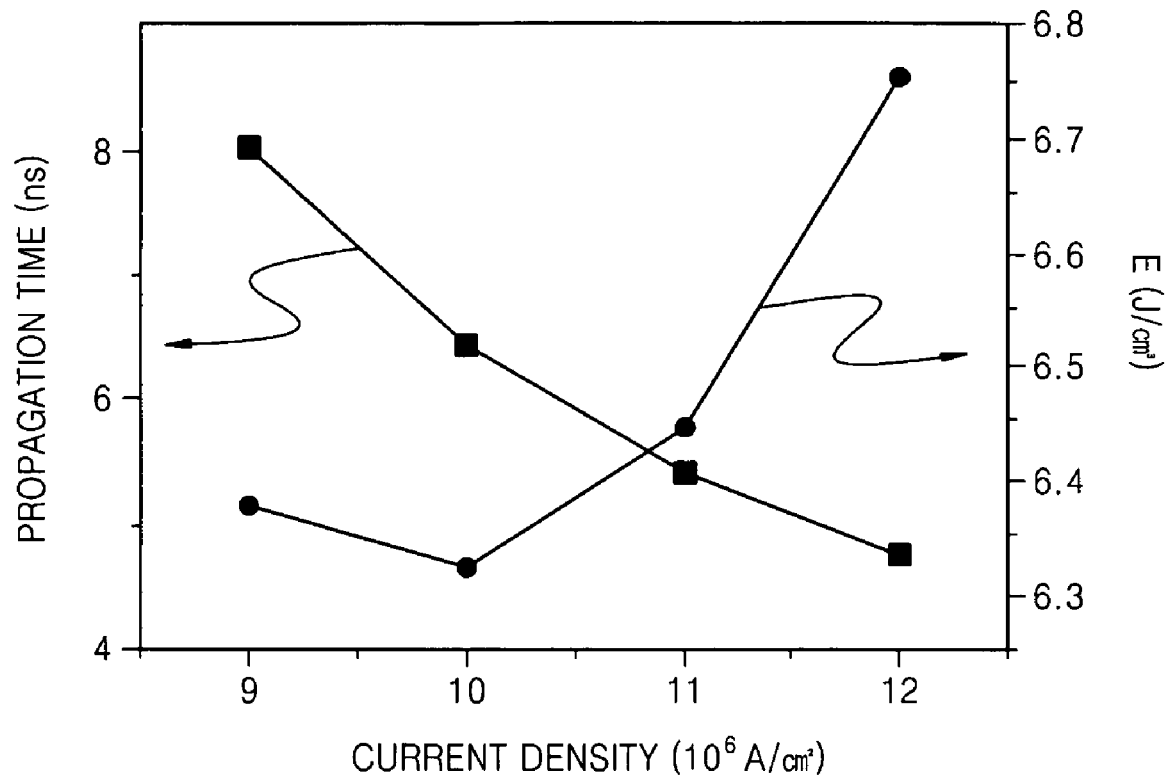
FIG. 7 is a graph showing the variations of propagation time and electrical energy of an information storage device according to the current density of a second pulse current.

FIGS. 6 and 7 are graphs showing data yielded in a simulation of a propagation process in which the magnetic domain wall is already depinned.

FIG. 6 is a graph showing propagation time of an information storage device according to the current density of a second pulse current.

Referring to FIG. 6, after applying a current density of about $16 \times 10^6$ A/cm$^2$ as a first pulse current for about 1 nsec, energy used for moving the magnetic domain wall due to a second pulse current was simulated. As shown, the magnetic domain wall moving time is reduced as the second pulse current increases.

FIG. 7 is a graph showing the variations of propagation time and electrical energy of an information storage device according to the current density of a second pulse current.

Referring to FIG. 7, the magnetic domain wall moving time decreases due to an increase in the second pulse current density. As shown in FIG. 7, a minimum energy for moving the magnetic domain wall occurs at the current density of about $10 \times 10^6$ A/cm$^2$.

Example embodiments may reduce energy used for moving the magnetic domain wall by applying pulse current densities, at which minimum energy is used, in the depinning process and the propagation process, respectively. This may be achieved by separating the depinning process and the propagation process as discussed above in conjunction with example embodiments. This is in contrast to conventional methods in which identical pulse currents for both depinning and propagation processes are applied.

In an example, conventional method, a current density of $16 \times 10^6$ A/cm$^2$ for 4.604 ns was applied to move the magnetic domain wall, and the energy consumption was 11.59 J/cm$^3$. In a method of magnetic domain wall movement according to example embodiments, a current density of about $16 \times 10^6$ A/cm$^2$ as the first pulse current (e.g., Jd) for about 1 ns is used and a current density of about $10 \times 10^6$ A/cm$^2$ as the second pulse current (e.g., Jp) for about 6.452 ns is used. In this example, the energy consumption at this point is about 8.87 J/cm$^3$. Accordingly, methods of moving the magnetic domain wall according to example embodiments may reduce power consumption by approximately 24% relative to that of conventional methods.

While the present invention has been particularly shown and described with reference to example embodiments thereof, it will be understood by one of ordinary skill in the art that various changes in form and details may be made therein without departing from the spirit and scope of the present invention as defined by the following claims.

What is claimed is:

1. A method of operating an information storage device using magnetic domain wall movement in a magnetic nanowire including a plurality of magnetic domains and pinning sites formed in regions between the plurality of magnetic domains, the method comprising:
    depinning a magnetic domain wall from a first pinning site by applying a first pulse current to the magnetic nanowire, the first pulse current having a first pulse current density; and
    moving the magnetic domain wall to a second pinning site by applying a second pulse current to the magnetic nanowire, the second pulse current having a second pulse current density, the first pulse current density being greater than the second pulse current density, and the second pulse current density being greater than zero.

2. The method of claim 1, wherein the first pulse current density is greater than a critical current density for depinning the magnetic domain wall from the first pinning site.

3. The method of claim 1, wherein the second pulse current density has a duration longer than a duration of the first pulse current density.

4. The method of claim 1, wherein the first pulse current density is a pulse current density associated with a minimum electrical energy used in the depinning operation.

5. The method of claim 4, wherein the second pulse current density is a pulse current density associated with a minimum electrical energy in the moving operation.

6. The method of claim 1, wherein the first pulse current density and the second pulse current density are pulse current densities for which a sum of electrical energies of the depinning and the moving operations is a minimum value.

7. The method of claim 1, wherein the first pulse current and the second pulse current form a stepped waveform.

* * * * *